United States Patent
Yang

(10) Patent No.: US 11,249,987 B2
(45) Date of Patent: Feb. 15, 2022

(54) DATA STORAGE IN BLOCKCHAIN-TYPE LEDGER

(71) Applicant: Advanced New Technologies Co., Ltd., Grand Cayman (KY)

(72) Inventor: Xinying Yang, Hangzhou (CN)

(73) Assignee: Advanced New Technologies Co., Ltd., Grand Cayman (KY)

( * ) Notice: Subject to any disclaimer, the term of this patent is extended or adjusted under 35 U.S.C. 154(b) by 0 days.

(21) Appl. No.: 16/812,036

(22) Filed: Mar. 6, 2020

(65) Prior Publication Data

US 2020/0210411 A1 Jul. 2, 2020

Related U.S. Application Data

(63) Continuation of application No. PCT/CN2020/071339, filed on Jan. 10, 2020.

(30) Foreign Application Priority Data

Aug. 14, 2019 (CN) .......................... 201910747305.1

(51) Int. Cl.
*G06F 16/00* (2019.01)
*G06F 16/23* (2019.01)
(Continued)

(52) U.S. Cl.
CPC ...... *G06F 16/2379* (2019.01); *G06F 16/2255* (2019.01); *G06F 16/245* (2019.01); *H03M 7/30* (2013.01)

(58) Field of Classification Search
CPC ...... H03M 7/30; H03M 7/6011; H03M 7/607; H03M 7/6094; G06F 16/2379; G06F 16/245

See application file for complete search history.

(56) References Cited

U.S. PATENT DOCUMENTS 8,156,241 B1 4/2012 Mukherjee et al.
8,327,026 B1 * 12/2012 Tripathi ................. H04L 69/04
709/247
(Continued)

FOREIGN PATENT DOCUMENTS

CN 106484852 3/2017
CN 107728941 2/2018
(Continued)

OTHER PUBLICATIONS

Crosby et al., "BlockChain Technology: Beyond Bitcoin," Sutardja Center for Entrepreneurship & Technology Technical Report, Oct. 16, 2015, 35 pages.
(Continued)

*Primary Examiner* — Augustine K. Obisesan
(74) *Attorney, Agent, or Firm* — Fish & Richardson P.C.

(57) ABSTRACT

This disclosure relates to data storage in a blockchain-type ledger storing data based on a blockchain data structure. In one aspect, a method includes obtaining service data. A compression threshold on which selection of a target object for performing data compression is based is determined. The target object includes a client device or a database server. At least one of a hardware performance parameter or a network performance parameter is obtained. A compression weight is determined based on at least one of the hardware performance parameter or the network performance parameter. When the compression weight is greater than a predetermined value, data compression is performed on the service data at the client device. When the compression weight is less than or equal to the predetermined value, the client device sends the service data to the database server so that the database server performs data compression on the service data.

20 Claims, 6 Drawing Sheets

(51) Int. Cl.
*H03M 7/30* (2006.01)
*G06F 16/245* (2019.01)
*G06F 16/22* (2019.01)

(56) References Cited

U.S. PATENT DOCUMENTS

| | | | | |
|---|---|---|---|---|
| 8,417,833 | B1* | 4/2013 | Amdahl | H04L 69/04 |
| | | | | 709/247 |
| 9,385,749 | B1* | 7/2016 | Nam | H03M 7/607 |
| 2004/0103215 | A1* | 5/2004 | Ernst | H04L 69/04 |
| | | | | 709/247 |
| 2006/0195464 | A1* | 8/2006 | Guo | H04L 65/605 |
| 2007/0104113 | A1* | 5/2007 | Mega | H04L 43/00 |
| | | | | 370/252 |
| 2007/0104118 | A1* | 5/2007 | Mega | H04L 69/04 |
| | | | | 370/254 |
| 2011/0238737 | A1* | 9/2011 | Agrawal | G06F 9/5072 |
| | | | | 709/203 |
| 2013/0054838 | A1* | 2/2013 | Tripathi | H03M 7/607 |
| | | | | 709/247 |
| 2014/0237201 | A1* | 8/2014 | Swift | G06F 3/065 |
| | | | | 711/162 |
| 2015/0304441 | A1* | 10/2015 | Ichien | H04L 67/2828 |
| | | | | 709/247 |
| 2016/0134723 | A1* | 5/2016 | Gupta | H04L 67/2828 |
| | | | | 709/247 |
| 2017/0214773 | A1* | 7/2017 | Fan | H03M 7/40 |
| 2018/0134723 | A1 | 5/2018 | Tets et al. | |
| 2019/0104077 | A1* | 4/2019 | Burgess | H03M 7/6064 |
| 2019/0146946 | A1* | 5/2019 | Zhang | G06F 16/1744 |
| | | | | 707/667 |
| 2019/0339876 | A1* | 11/2019 | Auvenshine | G06F 3/0608 |

FOREIGN PATENT DOCUMENTS

| | | | | |
|---|---|---|---|---|
| CN | 109614043 | | 4/2019 | |
| CN | 110022315 | | 7/2019 | |
| CN | 110597461 | | 12/2019 | |
| CN | 110597462 | | 12/2019 | |
| WO | WO-2013186322 | A2 * | 12/2013 | H04W 8/22 |

OTHER PUBLICATIONS

Nakamoto, "Bitcoin: A Peer-to-Peer Electronic Cash System," www.bitcoin.org, 2005, 9 pages.
International Search Report and Written Opinion in PCT Appln. No. PCT/CN2020/071339, dated Apr. 28, 2020, 9 pages (full machine translation).

* cited by examiner

DATA STORAGE IN BLOCKCHAIN-TYPE LEDGER

CROSS-REFERENCE TO RELATED APPLICATIONS

This application is a continuation of PCT Application No. PCT/CN2020/071339, filed on Jan. 10, 2020, which claims priority to Chinese Patent Application No. 201910747305.1, filed on Aug. 14, 2019, and each application is hereby incorporated by reference in its entirety.

TECHNICAL FIELD

Implementations of the present specification relate to the field of information technologies, and in particular, to data storage in a blockchain-type ledger storing data based on a blockchain data structure (e.g., in a form of a blockchain).

BACKGROUND

When a centralized blockchain-type ledger is used to store service data of a user, the user usually uploads a large amount of data as an entirety for storage at a time, for example, a report with a large data volume, or a plurality of reports of the same type for the same service, or an evidence including a plurality of videos, images, etc. In this process, the user usually needs to upload a plurality of files at a time or upload a large amount of data at a time. If the original files uploaded by the user are written into the ledger, the efficiency is too low, which affects the writing speed of the ledger.

SUMMARY

Implementations of the present specification aim at providing data storage methods for improving storage efficiency in a blockchain-type ledger. To alleviate the previous technical problem, the implementations of the present specification are implemented as described below.

According to an aspect, the present specification provides a data storage method in a blockchain-type ledger. The method is applied to a client and includes: obtaining service data of a user, and determining a compression threshold of the user, where the compression threshold is used to determine a target object for performing data compression, and the target object for performing data compression includes a client or a database server; obtaining at least one of: hardware specifications or network environment specifications of a device in which the client is located, and determining a compression weight based on at least one of: the hardware specifications or the network environment specifications, where the compression weight is positively correlated with the hardware specifications and negatively correlated with the network environment specifications; and if the compression weight is greater than a predetermined value, performing data compression on the service data in the client to generate compressed data of the service data, and sending the compressed data to the database server; or otherwise, sending, by the client, the service data to the database server so that the database server performs data compression to generate compressed data of the service data.

In correspondence to the aspect, implementations of the present specification further provide a data storage apparatus in a blockchain-type ledger. The apparatus is applied to a client and includes: an acquisition module, configured to obtain service data of a user, and determine a compression threshold of the user, where the compression threshold is used to determine a target object for performing data compression, and the target object for performing data compression includes a client or a database server; a determining module, configured to obtain at least one of: hardware specifications or network environment specifications of a device in which the client is located, and determine a compression weight based on at least one of: the hardware specifications or the network environment specifications, where the compression weight is positively correlated with the hardware specifications and negatively correlated with the network environment specifications; a compression module, configured to: if the compression weight is greater than a predetermined value, perform data compression on the service data in the client to generate compressed data of the service data; and a sending module, configured to send the compressed data to the database server, where the sending module is further configured to: if the compression weight is not greater than a predetermined value, send the service data to the database server so that the database server performs data compression to generate compressed data of the service data.

According to another aspect, the implementations of the present specification further provide a data storage method in a blockchain-type ledger. The method is applied to a database server and includes: receiving compressed data sent by a client, where the compressed data is obtained through compressing service data by the client; or receiving service data sent by a client, and compressing the service data to obtain compressed data; confirming that the compressed data is a data record to be stored, and determining a hash value of each data record; and when a predetermined block-forming condition is satisfied, determining each data record to be written into a data block, and generating the Nth data block including a hash value of the data block and the data record, where when N=1, a hash value and a block height of an initial data block are predetermined; or when N>1, the hash value of the Nth data block is determined based on each data record to be written into the data block and a hash value of the (N−1)th data block, and the Nth data block including the hash value of the Nth data block and each data record is generated.

In correspondence to the another aspect, the implementations of the present specification further provide a data storage apparatus in a blockchain-type ledger. The apparatus is applied to a client and includes: an acquisition module, configured to obtain service data of a user, and determine a compression threshold of the user, where the compression threshold is used to determine a target object for performing data compression, and the target object for performing data compression includes a client or a database server; a determining module, configured to obtain at least one of: hardware specifications or network environment specifications of a device in which the client is located, and determine a compression weight based on at least one of: the hardware specifications or the network environment specifications, where the compression weight is positively correlated with the hardware specifications and negatively correlated with the network environment specifications; a compression module, configured to: if the compression weight is greater than a predetermined value, perform data compression on the service data in the client to generate compressed data of the service data; and a sending module, configured to send the compressed data to the database server, where the sending module is further configured to: if the compression weight is not greater than a predetermined value, send the service data to the database server so that the database server performs data compression to generate compressed data of the service data.

In the solution provided in the implementations of the present specification, when the client receives the service data sent by the user, dynamic assessment is performed through obtaining hardware device specifications and network environment specifications of the client, to determine whether compression on the service data is performed by the client or the database server. After the compression, the database server writes the compressed data into a blockchain-type ledger to save occupation space of the ledger and improve writing efficiency of the ledger.

It should be understood that the previous general description and the following detailed description are merely examples and explanations, and cannot limit the implementations of the present specification.

In addition, any one of the implementations of the present specification does not need to implement all the previous effects.

BRIEF DESCRIPTION OF DRAWINGS

To describe the technical solutions in the implementations of the present specification or in the existing technology more clearly, the following briefly describes the accompanying drawings required for describing the implementations or the existing technology. Clearly, the accompanying drawings in the following description merely show some implementations of the present specification, and a person of ordinary skill in the art can still derive other drawings from these accompanying drawings.

DESCRIPTION OF IMPLEMENTATIONS

To make a person skilled in the art understand the technical solutions in the implementations of the present specification better, the following clearly and comprehensively describes the technical solutions in the implementations of the present specification with reference to the accompanying drawings in the implementations of the present specification. Clearly, the described implementations are merely some but not all of the implementations of the present specification. All other implementations obtained by a person of ordinary skill in the art based on the implementations of the present specification shall fall within the protection scope of the present specification.

Figure 1:
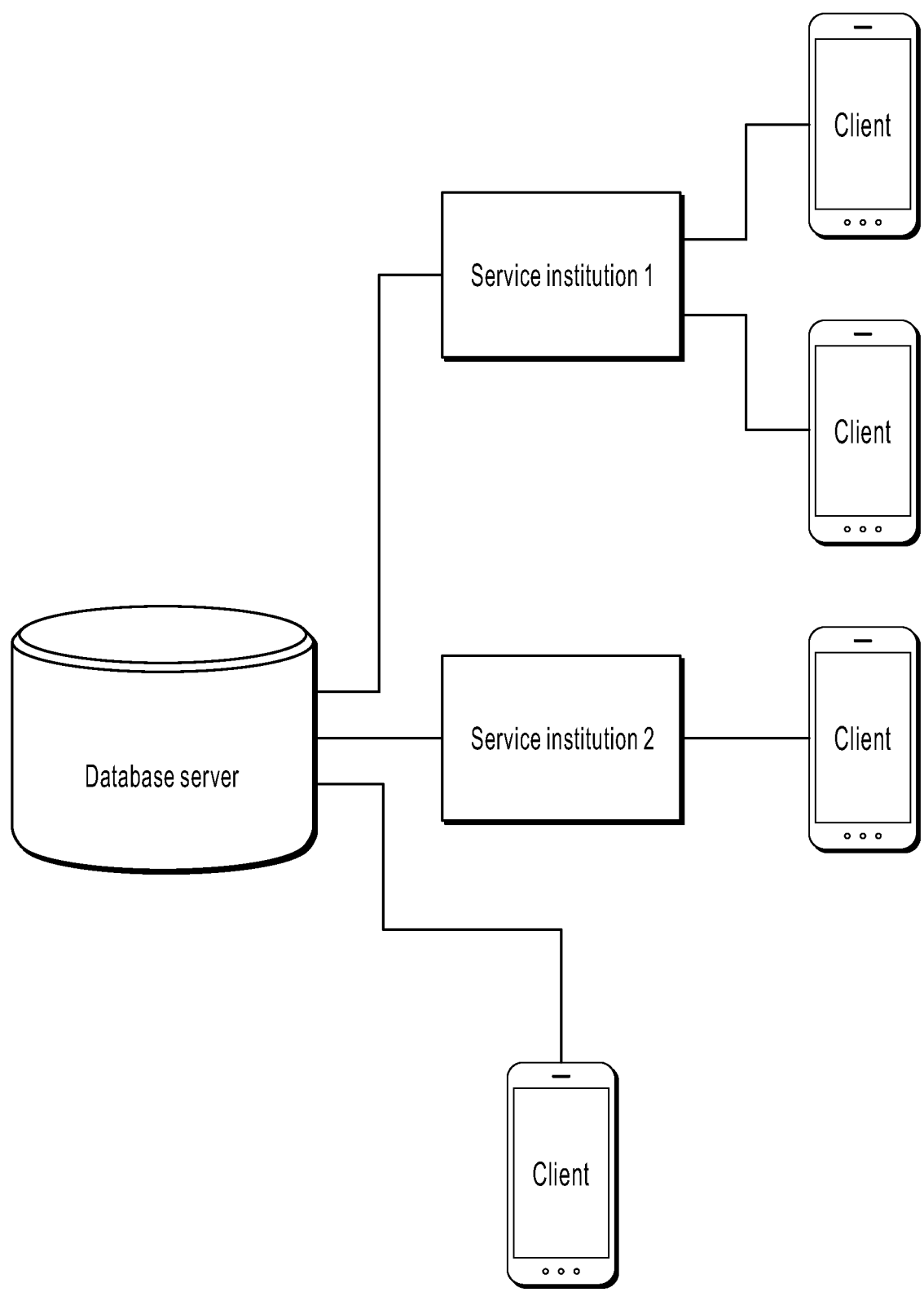
FIG. 1 is a schematic architectural diagram illustrating a system, according to an implementation of the present specification.

In the implementations of the present specification, a database server provides a data storage service for a client by using a centralized method. A user of the client can be an organization or an individual user. For example, the user uploads a recorded video or a photographed image to the database server by using a device of the user, or uploads a recorded video or a photographed image to the database server by using a judicial institution. As shown in FIG. 1, FIG. 1 is a schematic architectural diagram illustrating a system, according to an implementation of the present specification.

Figure 2:
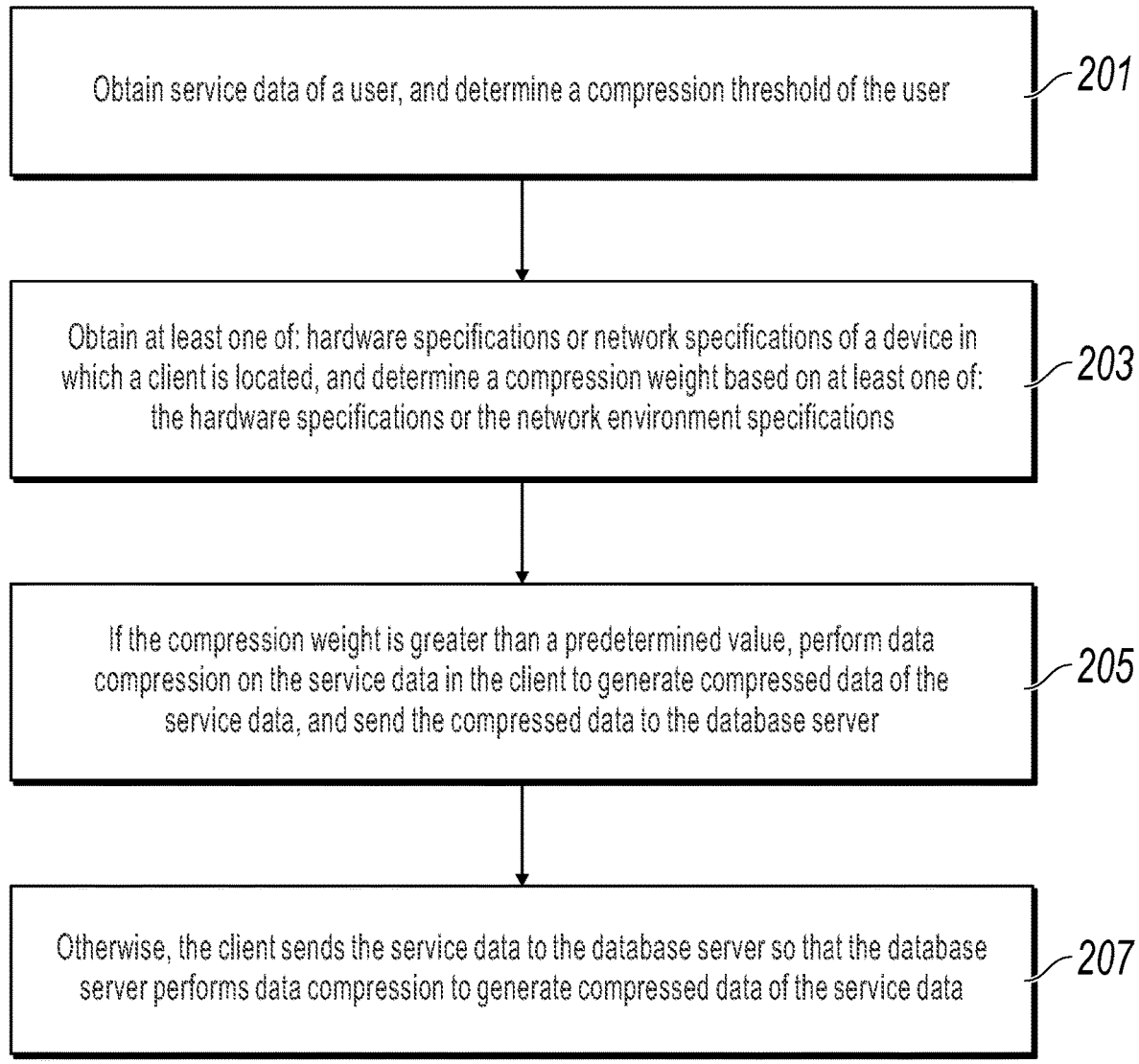
FIG. 2 is a schematic flowchart illustrating a data storage method in a blockchain-type ledger, according to an implementation of the present specification.

The following describes in detail the technical solutions provided in the implementations of the present specification with reference to the accompanying drawings. One aspect of the present specification is shown in FIG. 2. FIG. 2 is a schematic flowchart illustrating a data storage method in a blockchain-type ledger, according to an implementation of the present specification. The method is applied to a client. The procedure includes the following steps:

201. Obtain service data of a user, and determine a compression threshold of the user.

The service data can be various expense records of an individual user of the client, or can be a service result, an intermediate state, an operation record, etc. generated when an application server executes service logic based on an instruction of the user. A service scenario can include an expense record, an audit log, a supply chain, a government supervision record, a medical record, etc. For example, in financial supervision, the service data can be various reports that a financial institution needs to report.

The compression threshold of the user can be a constant determined in advance based on at least one of: hardware specifications of the user or network environment specifications. For example, the compression threshold is equal to 1. Generally, the compression threshold can correspond to a common device condition. For example, a device condition corresponding to a compression weight threshold 1 is 2.2 GHz, 4 CPU, 2 G memory, broadband Internet access, and 8 M upload bandwidth.

The compression threshold can be counted and dynamically adjusted by the database server based on the accessed client and can be locally stored by the client. The client can obtain the compression threshold at any time.

203. Obtain at least one of: the hardware specifications or the network environment specifications of a device in which a client is located, and determine the compression weight based on at least one of: the hardware specifications or the network environment specifications.

The hardware specifications of the device can include a CPU frequency, a CPU core quantity, a memory size, etc. of the device. The network environment specifications of the device can include a network connection mode of the device, upload bandwidth of the device, etc. Each hardware specifications can be represented by using a corresponding value. For example, the CPU frequency 2.2 GHz is represented as 2.2, the 4 CPU is represented as 4, the 2 G memory is represented as 2, the wired Internet access is represented as 4, and the upload bandwidth 8 M/s is represented as 8.

Generally, better hardware performance indicates larger hardware specifications, and better network environment indicates larger network environment specifications.

A compression weight is comprehensively calculated by using specifications, and is compared with the compression weight threshold. For example, a calculation method is the compression weight M=k*(CPU frequency*core quantity*memory)/(Internet access method*upload bandwidth). Here, k is an empirical parameter and can be set by the user. If the compression weight is greater than the compression weight threshold, the client performs compression; or otherwise, the database server performs compression.

For example, a device condition corresponding to the compression weight threshold 1 is 2.2 GHz, 4 CPU, 2 G memory, broadband Internet access, and 8 M upload bandwidth. It can be known that the database server performs compression in the case of a worse hardware condition of the device or a better network condition.

The essence of dynamic compression is to implement more efficient compression and transmission based on the device hardware condition and network condition of the client. If the device hardware condition of the client is better and the network condition is worse, the client performs compression; or otherwise, the database server performs compression, to improve data transmission efficiency.

205. If the compression weight is greater than a predetermined value, perform data compression on the service data in the client to generate compressed data of the service data, and send the compressed data to the database server.

Specific compression methods include conventional reversible lossless compression. In this compression method, the original service data can be restored based on the compressed data. For example, a report is compressed into a compressed packet in a format such as RAR or ZIP.

In some implementations of the present specification, another compression method can be further performed. To be specific, a hash value of the service data is determined, the hash value of the service data is determined as the compressed data, and the hash value is further determined as data to be stored. In this method, the "compressed data" cannot be restored to obtain the corresponding service data. However, in consideration of uniqueness of a hash value, integrity of the data to be stored in a ledger can also be verified.

207. Otherwise, the client sends the service data to the database server so that the database server performs data compression to generate the compressed data of the service data.

Specifically, the client can directly send the service data to the database server. Alternatively, when the compression weight is not greater than the predetermined value (that is, the database server needs to perform compression in this case), a corresponding compression identifier can be added in this case, and the compression identifier is used to indicate that the service data needs to be compressed.

In practice, the client can further distinguish between service data. For example, some service data is relatively small and does not need to be compressed, but some service data is relatively large and needs to be compressed.

In an implementation, the compression identifier can be added for only some service data, and then a function of parsing a service request and identifying a flag bit can be added for the database server. For example, the compression identifier is added to service data whose occupation space exceeds a specified size, and the compression identifier is not added to relatively small service data.

Certainly, a flag bit can also be uniformly added to all service data, and distinguishing is implemented by assigning values to different flag bits. This is not limited in the present application.

Figure 3:
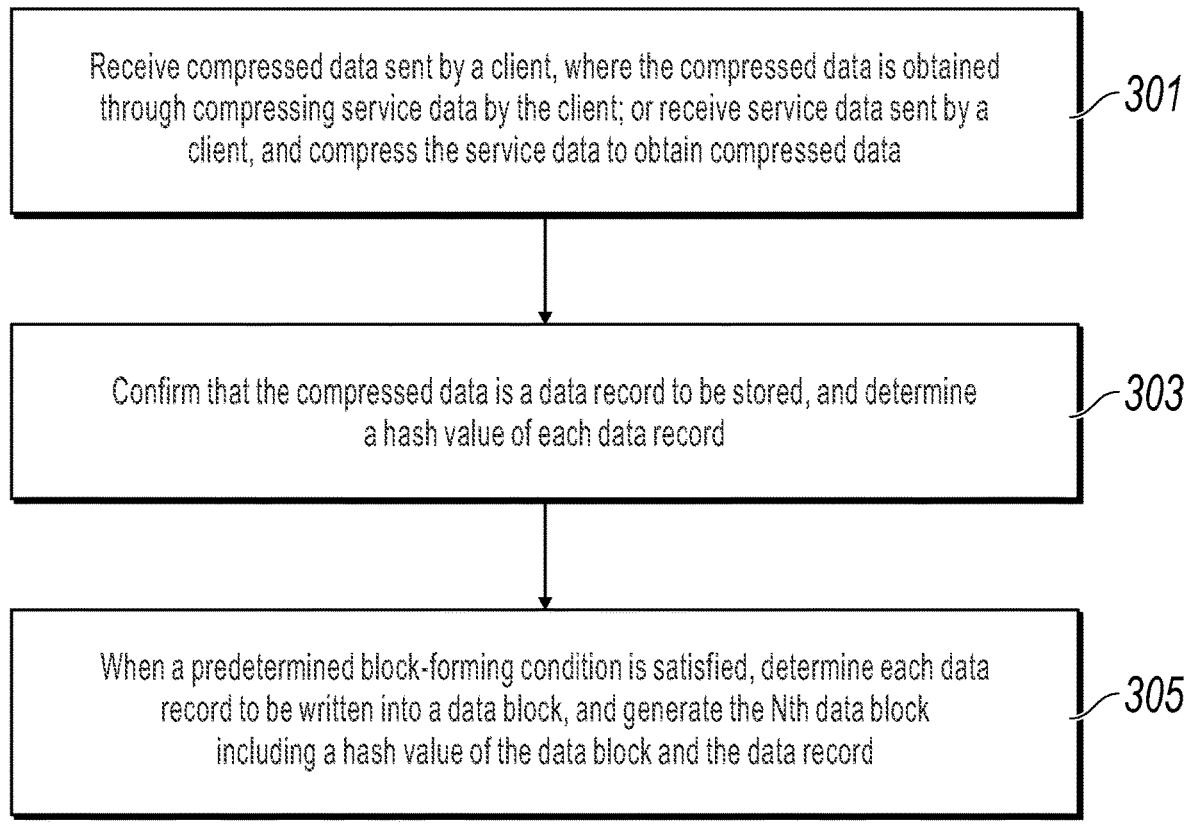
FIG. 3 is a schematic flowchart illustrating another data storage method in a blockchain-type ledger, according to an implementation of the present specification.

The above part provides a corresponding description for the client in the implementations of the present specification. In addition, an implementation of the present specification further provides a data storage method in a blockchain-type ledger. The method is applied to a database server. As shown in FIG. 3, FIG. 3 is a schematic flowchart of another data storage method in a blockchain-type ledger, according to an implementation of the present specification. The method includes the following:

301. Receive compressed data sent by a client, where the compressed data is obtained through compressing service data by the client; or receive service data sent by a client, and compress the service data to obtain compressed data.

As described above, in the implementation of the present specification, the service data needs to be compressed and then stored. In an implementation, the database server can perform a corresponding subsequent procedure based on whether the service data sent by the client includes a compression identifier. If yes, the database server performs compression. If no, it indicates that the client has performed compression, and the received data is the compressed data.

In an implementation, because a hardware condition and a network condition of the user are generally relatively stable, the hardware condition and the network condition of the user can be further saved. When the hardware condition and the network condition of the user do not change, the previous compression method is used. That is, if the database server performs compression at the previous time, the database server continues to perform compression at this time. If the database server does not perform compression at the previous time, the database server does not perform compression at this time.

303. Confirm that the compressed data is a data record to be stored, and determine a hash value of each data record.

Specifically, the database server can obtain a data record to be stored (that is, the previous data to be stored), determine a hash value of each data record to be stored, and return the hash value of the to-be-stored data record to the client, so that the client can query at any time.

It is worthwhile to note that, if the hash value of the service data is determined as the compressed data during compression, the hash value of the service data can be directly determined as the hash value of the data record to be stored. If lossless compression is performed during compression, the obtained hash value of the compressed packet is determined as the hash value of the data record to be stored.

305. When a predetermined block-forming condition is satisfied, determine each data record to be written into a data block, and generate the Nth data block including a hash value of the data block and the data record.

The predetermined block-forming condition includes that a quantity of data records to be stored reaches a quantity threshold, for example, a new data block is generated each time one thousand data records are received and the one thousand data records are recorded into the block; or a time interval from the latest block-forming time reaches a time threshold, for example, a new data block is generated at intervals of five minutes and data records received within the five minutes are written into the block.

Here, N indicates a sequence number of a data block. In other words, in the implementations of the present specification, data blocks are arranged in the form of a chain in an order of block-forming times, and therefore are time sensitive. Block heights of the data blocks are monotonously increased based on the order of block-forming times. The block height can be a sequence number. In this case, the block height of the Nth data block is N. The block height can also be generated in another method.

When N=1, the data block in this case is an initial data block. A hash value and a block height of the initial data block are predetermined. For example, the initial data block does not include a data record, the hash value is any given hash value, and the block height blknum is equal to 0. For another example, a trigger condition for generating the initial data block is consistent with a trigger condition for another data block, but the hash value of the initial data block is determined based on a hash value for all content in the initial data block.

When N>1, because the content and the hash value of the previous data block are determined, in this case, a hash value of a current data block (the Nth data block) can be generated based on the hash value of the previous data block (that is, the (N−1)th data block). For example, in a feasible method, each hash value of a data record to be written into the Nth data block is determined, a Merkel tree is generated based on an arrangement order in the block, a root hash value of the Merkel tree is connected with the hash value of the previous data block, and the hash value of the current block is generated by using a hash algorithm. For another example, connection can be performed based on an order of data records in a block to obtain a hash value of all data records, a hash value of a previous data block is connected with the hash value of all the data records, and a hash operation is performed on a string obtained through connection to generate a hash value of a data block.

It is worthwhile to note that in this process, based on different compression methods, if data to be stored is compressed data of service data, a hash value of each piece of compressed data needs to be calculated when the root hash value of the Merkel tree is calculated; if data to be stored is the hash value of the service data, a hash value of each piece of service data needs to be calculated when the root hash value of the Merkel tree is calculated.

After the user successfully uploads data, a hash value of a corresponding data record and a hash value of a data block in which the data record is located can be obtained and stored, and integrity verification can be initiated based on the hash value. A verification method includes recalculating the hash value of the data record and the hash value of the data block in which the data record is located, and comparing the hash values with locally stored hash values.

The data block generated in the above method can include a block header and a block body. The block can be used to store a plaintext of the connected data, the hash value of the connected data, etc. The block header can be used to store metadata about the data block, for example, a version number of a ledger, a hash value of a previous data block, a root hash value of a Merkel tree formed by connected data in the data block, or a hash value of the data block, to record a state array of operation states of the connected data.

In the solution provided in the implementations of the present specification, when the client receives the service data sent by the user, dynamic assessment is performed through obtaining a hardware device specifications and a network environment specifications of the client, to determine whether compression on the service data is performed by the client or the database server. After the compression, the database server writes the compressed data into a blockchain-type ledger to save occupation space of the ledger and improve write efficiency of the ledger.

In an implementation, after compressing the service data, the database server further needs to locally store the service data, and record a mapping relationship between the service data and the compressed data of the service data. The mapping relationship between each of the name of the compressed data and the name of the service data, and a storage location can be recorded. If the compressed data is the hash value of the service data, in this case, a mapping relationship between a storage location of the service data and the hash value of the service data can be further recorded for ease of subsequent query.

In an implementation, the client can further initiate a query based on the hash value stored by the client, and send a query request including the hash value to the database server. The hash value can be the hash value of the compressed packet, or can be the hash value of the service data.

After the database server receives the query request, the database server can obtain the corresponding compressed data through query based on the hash value. When the compressed data is the compressed packet, the database server can obtain, from the ledger, the compressed packet corresponding to the hash value and return the corresponding compressed packet to the client. When the hash value is the hash value of the service data, the database server can obtain the service data through query based on the mapping relationship between the storage location of the service data and the hash value of the service data, and return the service data and the hash value of the service data to the client, so that the client uses the service data to verify the integrity of the service data.

Figure 4:
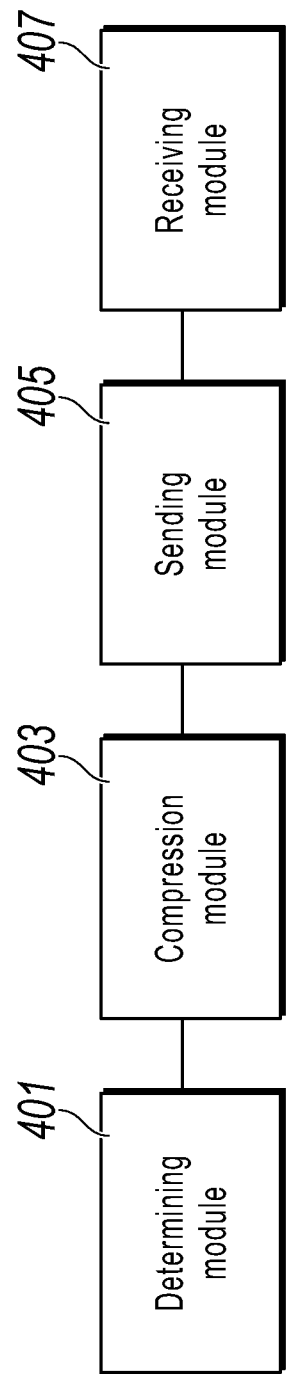
FIG. 4 is a schematic structural diagram illustrating a data storage apparatus in a blockchain-type ledger, according to an implementation of the present specification.

In correspondence to the aspect, an implementation of the present specification further provides a data storage apparatus in a blockchain-type ledger. The apparatus is applied to a client. FIG. 4 is a schematic structural diagram illustrating a data storage apparatus in a blockchain-type ledger, according to an implementation of the present specification. As shown in FIG. 4, the apparatus includes an acquisition module, a determining module 401, a compression module 403, and a sending module 405.

The acquisition module is configured to obtain service data of a user, and determine a compression threshold of the user. The compression threshold is used to determine a target object for performing data compression. The target object for performing data compression includes a client or a database server.

The determining module 401 is configured to obtain at least one of: hardware specifications or network environment specifications of a device in which the client is located, and determine a compression weight based on at least one of: the hardware specifications or the network environment specifications. The compression weight is positively correlated with the hardware specifications and negatively correlated with the network environment specifications.

The compression module 403 is configured to: if the compression weight is greater than a predetermined value, perform data compression on the service data in the client to generate compressed data of the service data.

The sending module 405 is configured to send the compressed data to the database server. The sending module is further configured to: if the compression weight is not greater than a predetermined value, send the service data to the database server so that the database server performs data compression to generate compressed data of the service data.

The compression module 403 is further configured to perform lossless compression on the service data to generate a compressed packet in which the service data is recoverable; or determine a hash value of the service data, and determine the hash value of the service data as compressed data.

The sending module 405 is further configured to send the service data and a compression identifier to the database server. The compression identifier indicates that the database server needs to perform data compression on the service data.

The sending module 405 is further configured to send a query request including a hash value to the database server so that the database server obtains the corresponding compressed data through query based on the hash value. The apparatus further includes a receiving module 407, configured to receive the compressed data returned by the database server, and decompress the compressed data to obtain the corresponding service data.

Figure 5:
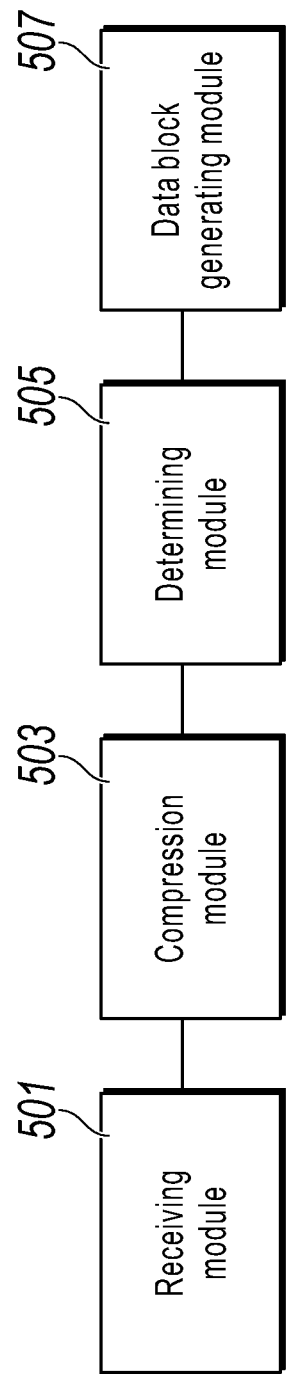
FIG. 5 is a schematic structural diagram illustrating another data storage apparatus in a blockchain-type ledger, according to an implementation of the present specification.

In correspondence to the another aspect, an implementation of the present specification further provides a data storage apparatus in a blockchain-type ledger. The apparatus is applied to a database server. FIG. 5 is a schematic structural diagram illustrating a data storage apparatus in a blockchain-type ledger, according to an implementation of the present specification. As shown in FIG. 5, the apparatus includes a receiving module 501, a compression module 503, a determining module 505, and a data block generating module 507.

The receiving module 501 is configured to receive compressed data sent by a client, where the compressed data is obtained through compressing service data by the client; or receive service data sent by a client.

The compression module 503 is configured to compress the service data to obtain compressed data.

The determining module 505 is configured to confirm that the compressed data is a data record to be stored, and determine a hash value of each data record.

The data block generating module 507 is configured to: when a predetermined block-forming condition is satisfied, determine each data record to be written into a data block, and generate the Nth data block including a hash value of the data block and the data record.

When N=1, a hash value and a block height of an initial data block are predetermined; or when N>1, the hash value of the Nth data block is determined based on each data record to be written into the data block and a hash value of the (N−1)th data block, and the Nth data block including the hash value of the Nth data block and each data record is generated.

Further, the predetermined block-forming condition includes that a quantity of data records to be stored reaches a quantity threshold; or a time interval from the latest block-forming time reaches a time threshold.

Further, the apparatus further includes a query module 509, configured to receive a query request including a hash value and sent by the client; obtain, through query, compressed data corresponding to the hash value; and send the compressed data to the client so that the client decompresses the compressed data.

Further, the receiving module 501 is further configured to receive the service data sent by the client; detect whether the service data includes a compression identifier, where the compression identifier indicates that the database server needs to perform data compression on the service data; and compress the service data to generate the compressed data if the service data comprises the compression identifier.

An implementation of the present specification further provides a computer device. The computer device includes at least a memory, a processor, and a computer program that is stored in the memory and that can run on the processor. When executing the program, the processor performs the data storage method in a blockchain-type ledger shown in FIG. 2.

An implementation of the present specification further provides a computer device. The computer device includes at least a memory, a processor, and a computer program that is stored in the memory and that can run on the processor. When executing the program, the processor performs the data storage method in a blockchain-type ledger shown in FIG. 3.

Figure 6:
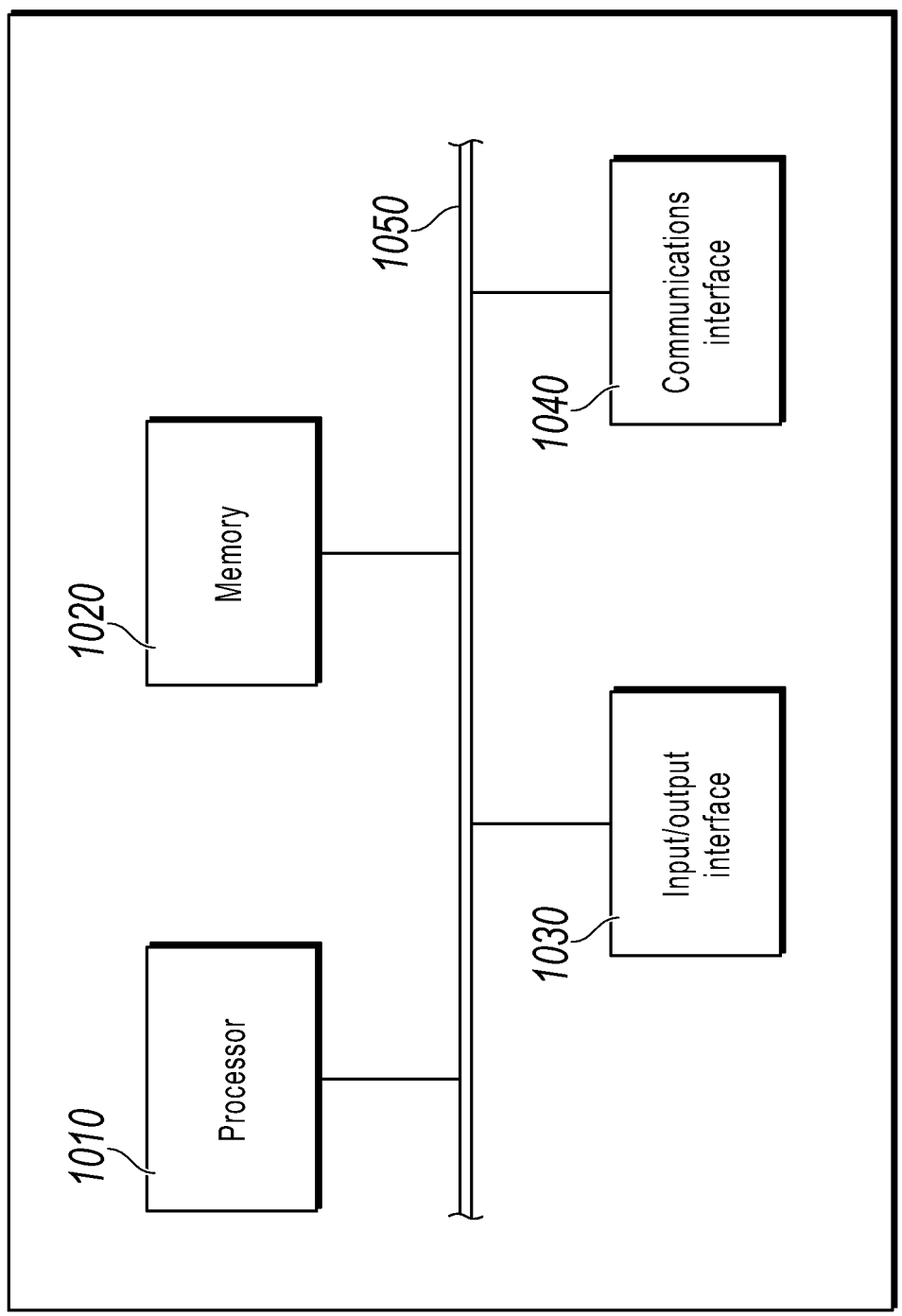
FIG. 6 is a schematic structural diagram illustrating a device for configuring the method, according to an implementation of the present specification.

FIG. 6 is a more detailed schematic diagram illustrating a hardware structure of a computing device, according to an implementation of the present specification. The device can include a processor 1010, a memory 1020, an input/output interface 1030, a communications interface 1040, and a bus 1050. The processor 1010, the memory 1020, the input/output interface 1030, and the communications interface 1040 are communicatively connected to each other in the device by using the bus 1050.

The processor 1010 can be implemented by using a general central processing unit (CPU), a microprocessor, an application-specific integrated circuit (ASIC), one or more integrated circuits, etc., and is configured to execute a related program to implement the technical solutions provided in the implementations of the present specification.

The memory 1020 can be implemented by using a read-only memory (ROM), a random access memory (RAM), a static storage device, a dynamic storage device, etc. The memory 1020 can store an operating system and another application program. When the technical solutions provided in the implementations of the present specification are implemented by using software or firmware, related program code is stored in the memory 1020, and is invoked and executed by the processor 1010.

The input/output interface 1030 is configured to be connected to an input/output module, to input/output information. The input/output module (not shown in the figure) can be used as a component and configured in the device, or can be externally connected to the device, to provide a corresponding function. The input module can include a keyboard, a mouse, a touchscreen, a microphone, various sensors, etc. The output module can include a display, a speaker, an oscillator, an indicator, etc.

The communications interface 1040 is configured to be connected to a communications module (not shown in the figure), to implement a communication interaction between the device and another device. The communications module can implement communication in a wired method (for example, USB or a network cable), or can implement communication in a wireless method (for example, a mobile network, Wi-Fi, or Bluetooth).

The bus 1050 includes a channel used to transmit information between components (for example, the processor 1010, the memory 1020, the input/output interface 1030, and the communications interface 1040) of the device.

It is worthwhile to note that although only the processor 1010, the memory 1020, the input/output interface 1030, the communications interface 1040, and the bus 1050 of the device are shown, during specific implementation, the device can further include other components required for implementing normal running. In addition, a person skilled in the art can understand that the device can include only components necessary for implementing the solutions in the implementations of the present specification, but does not necessarily include all components shown in the figure.

An implementation of the present specification further provides a computer readable storage medium. The computer readable storage medium stores a computer program. When the program is executed by a processor, the data storage method in the blockchain-type ledger shown in FIG. 2 is implemented.

An implementation of the present specification further provides a computer readable storage medium. The computer readable storage medium stores a computer program.

When the program is executed by a processor, the data storage method in the blockchain-type ledger shown in FIG. 3 is implemented.

The computer readable medium includes persistent, non-persistent, movable, and unmovable media that can store information by using any method or technology. The information can be a computer readable instruction, a data structure, a program module, or other data. Examples of the computer storage medium include but are not limited to a phase change RAM (PRAM), a static RAM (SRAM), a dynamic RAM (DRAM), a RAM of another type, a ROM, an electrically erasable programmable ROM (EEPROM), a flash memory or another memory technology, a compact disc ROM (CD-ROM), a digital versatile disc (DVD) or another optical storage, a cassette, a cassette magnetic disk storage or another magnetic storage device, or any other non-transmission medium. The computer storage medium can be configured to store information that can be accessed by a computing device. As described in the present specification, the computer readable medium does not include computer readable transitory media such as a modulated data signal and a carrier.

It can be seen from the previous descriptions of the implementations that, a person skilled in the art can clearly understand that the implementations of the present specification can be implemented by using software and a necessary general hardware platform. Based on such an understanding, the technical solutions in the implementations of the present specification essentially or the part contributing to the existing technology can be implemented in a form of a software product. The computer software product can be stored in a storage medium, such as a ROM/RAM, a magnetic disk, or an optical disc, and includes several instructions for instructing a computer device (which can be a personal computer, a server, a network device, etc.) to perform the method described in the implementations of the present specification or in some parts of the implementations of the present specification.

The system, method, module, or unit illustrated in the previous implementations can be implemented by using a computer chip or an entity, or can be implemented by using a product having a certain function. A typical implementation device is a computer, and the computer can be a personal computer, a laptop computer, a cellular phone, a camera phone, an smartphone, a personal digital assistant, a media player, a navigation device, an email receiving and sending device, a game console, a tablet computer, a wearable device, or any combination of these devices.

The implementations in the present specification are described in a progressive way. For same or similar parts of the implementations, references can be made to the implementations. Each implementation focuses on a difference from other implementations. Particularly, an apparatus implementation is similar to a method implementation, and therefore is described briefly. For a related part, references can be made to some descriptions in the method implementation. The previously described apparatus implementations are merely examples. The modules described as separate parts can or cannot be physically separate. During implementation of the solutions in the implementations of the present specification, functions of the modules can be implemented in one or more pieces of software and/or hardware. Some or all of the modules can be selected based on an actual need to implement the solutions of the implementations. A person of ordinary skill in the art can understand and implement the implementations of the present specification without creative efforts.

The previous descriptions are merely specific implementations of the implementations of the present specification. It is worthwhile to note that a person of ordinary skill in the art can further make several improvements or polishing without departing from the principle of the implementations of the present specification, and the improvements or polishing shall fall within the protection scope of the implementations of the present specification.

What is claimed is:

1. A computer-implemented method for data storage, the method comprising:
   obtaining, for transmission from a client device to a database server, service data of a user;
   determining a compression threshold on which selection of a target object for performing data compression is based, wherein the target object for performing data compression comprises the client device or the database server;
   obtaining (i) a hardware specification for each of a plurality of hardware components of the client device and (ii) a network environment specification identifying a network connection mode of the client device, wherein the hardware specification for at least one of the hardware components comprises a static characteristic of the hardware component that remains constant during operation of the client device;
   determining a compression weight based on a combination of each hardware specification and the network environment specification, wherein the compression weight is positively correlated with each hardware specification and the compression weight is negatively correlated with the network environment specification, and wherein the combination of each hardware specification comprises a product of respective values for two or more hardware specifications for the hardware components; and
   when the compression weight is greater than the compression threshold, performing data compression on the service data at the client device to generate compressed data of the service data, and sending the compressed data to the database server, or
   when the compression weight is less than or equal to the compression threshold, sending, by the client device, the service data to the database server so that the database server performs data compression on the service data to generate the compressed data.

2. The computer-implemented method of claim 1, wherein performing data compression on the service data at the client device comprises:
   performing lossless compression on the service data to generate a compressed packet from which the service data is recoverable; or
   determining, as the compressed data, a hash value of the service data.

3. The computer-implemented method of claim 1, wherein sending the service data to the database server comprises:
   sending the service data and a compression identifier to the database server, wherein the compression identifier requests the database server to perform data compression on the service data.

4. The computer-implemented method of claim 1, further comprising receiving, from the database server, a hash value corresponding to the compressed data.

5. The computer-implemented method of claim 4, further comprising:

sending a query request comprising the hash value to the database server, the query request being configured to request the database server obtain the compressed data corresponding to the hash value through a query based on the hash value;

receiving the compressed data from the database server; and decompressing the compressed data to obtain the service data.

6. The computer-implemented method of claim 1, wherein the hardware specification for each of the plurality of hardware components comprises a quantity of processors installed on the client device.

7. The computer-implemented method of claim 1, wherein the network environment specification indicates whether the client device is connected to a network via a wired connection.

8. The computer-implemented method of claim 1, wherein determining the compression weight based on the combination of each hardware specification and the network environment specification comprises:

determining, as the product of respective values for two or more hardware specifications for the hardware components, a first product of a respective first value corresponding to each hardware specification;

determining a second product of a second value corresponding to the network connection mode of the client device and a third value corresponding to an upload bandwidth of the client device;

determining a quotient by dividing the first product by the second product; and determining, as the compression weight, a third product of the quotient and a constant value.

9. The computer-implemented method of claim 8, wherein the hardware specification for each of the plurality of hardware components of the client device comprises a number of processors of the client device, an operating frequency of each processor of the client device, and an amount of memory of the client device.

10. The computer-implemented method of claim 1, wherein determining the compression weight based on the combination of each hardware specification and the network environment specification comprises:

identifying a first value corresponding to a number of processors of the client device;

identifying a second value corresponding to an amount of memory of the client device;

identifying a third value corresponding to an operating frequency of each processor;

identifying a fourth value corresponding to the network connection mode of the client device;

identifying a fifth value corresponding to an upload bandwidth of the client device;

determining a first product of the first value, the second value, and the third value;

determining a second product of the fourth value and the fifth value; and determining a quotient by dividing the first product by the second product; and determining, as the compression weight, a third product of the quotient and a user-specified parameter.

11. A non-transitory, computer-readable medium storing one or more instructions executable by a computer system to perform operations comprising:

obtaining, for transmission from a client device to a database server, service data of a user;

determining a compression threshold on which selection of a target object for performing data compression is based, wherein the target object for performing data compression comprises the client device or the database server;

obtaining (i) a hardware specification for each of a plurality of hardware components of the client device and (ii) a network environment specification identifying a network connection mode of the client device, wherein the hardware specification for at least one of the hardware components comprises a static characteristic of the hardware component that remains constant during operation of the client device;

determining a compression weight based on a combination of each hardware specification and the network environment specification, wherein the compression weight is positively correlated with each hardware specification and the compression weight is negatively correlated with the network environment specification, and wherein the combination of each hardware specification comprises a product of respective values for two or more hardware specifications for the hardware components; and when the compression weight is greater than the compression threshold, performing data compression on the service data at the client device to generate compressed data of the service data, and sending the compressed data to the database server, or when the compression weight is less than or equal to the compression threshold, sending, by the client device, the service data to the database server so that the database server performs data compression on the service data to generate the compressed data.

12. The non-transitory, computer-readable medium of claim 11, wherein performing data compression on the service data at the client device comprises:

performing lossless compression on the service data to generate a compressed packet from which the service data is recoverable; or determining, as the compressed data, a hash value of the service data.

13. The non-transitory, computer-readable medium of claim 11, wherein sending the service data to the database server comprises:

sending the service data and a compression identifier to the database server, wherein the compression identifier requests the database server to perform data compression on the service data.

14. The non-transitory, computer-readable medium of claim 11, wherein the operations comprise receiving, from the database server, a hash value corresponding to the compressed data.

15. The non-transitory, computer-readable medium of claim 14, wherein the operations comprise:

sending a query request comprising the hash value to the database server, the query request being configured to request the database server obtain the compressed data corresponding to the hash value through a query based on the hash value;

receiving the compressed data from the database server; and decompressing the compressed data to obtain the service data.

16. A computer-implemented system, comprising:

one or more computers; and one or more computer memory devices interoperably coupled with the one or more computers and having tangible, non-transitory, machine-readable media storing one or more instructions that, when executed by the one or more computers, perform one or more operations comprising:
obtaining, for transmission from a client device to a database server, service data of a user;
determining a compression threshold on which selection of a target object for performing data compression is based, wherein the target object for performing data compression comprises the client device or the database server;
obtaining (i) a hardware specification for each of a plurality of hardware components of the client device and (ii) a network environment specification identifying a network connection mode of the client device, wherein the hardware specification for at least one of the hardware components comprises a static characteristic of the hardware component that remains constant during operation of the client device;
determining a compression weight based on a combination of each hardware specification and the network environment specification, wherein the compression weight is positively correlated with each hardware specification and the compression weight is negatively correlated with the network environment specification, and wherein the combination of each hardware specification comprises a product of respective values for two or more hardware specifications for the hardware components; and
when the compression weight is greater than the compression threshold, performing data compression on the service data at the client device to generate compressed data of the service data, and sending the compressed data to the database server, or
when the compression weight is less than or equal to the compression threshold, sending, by the client device, the service data to the database server so that the database server performs data compression on the service data to generate the compressed data.

17. The computer-implemented system of claim 16, wherein performing data compression on the service data at the client device comprises:
performing lossless compression on the service data to generate a compressed packet from which the service data is recoverable; or
determining, as the compressed data, a hash value of the service data.

18. The computer-implemented system of claim 16, wherein sending the service data to the database server comprises:
sending the service data and a compression identifier to the database server, wherein the compression identifier requests the database server to perform data compression on the service data.

19. The computer-implemented system of claim 16, wherein the operations comprise receiving, from the database server, a hash value corresponding to the compressed data.

20. The computer-implemented system of claim 19, wherein the operations comprise:
sending a query request comprising the hash value to the database server, the query request being configured to request the database server obtain the compressed data corresponding to the hash value through a query based on the hash value;
receiving the compressed data from the database server; and
decompressing the compressed data to obtain the service data.

* * * * *